(12) United States Patent
Muto

(10) Patent No.: US 9,973,170 B2
(45) Date of Patent: May 15, 2018

(54) HIGH-FREQUENCY MODULE

(71) Applicant: Murata Manufacturing Co., Ltd., Nagaokakyo-shi, Kyoto-fu (JP)

(72) Inventor: Hideki Muto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 144 days.

(21) Appl. No.: 15/045,320

(22) Filed: Feb. 17, 2016

(65) Prior Publication Data

US 2016/0164491 A1     Jun. 9, 2016

Related U.S. Application Data

(63) Continuation of application No. PCT/JP2014/066228, filed on Jun. 19, 2014.

(30) Foreign Application Priority Data

Aug. 20, 2013   (JP) ................................ 2013-170088

(51) Int. Cl.
    *H03H 9/72*     (2006.01)
    *H03H 9/54*     (2006.01)
    (Continued)

(52) U.S. Cl.
    CPC ............ *H03H 9/725* (2013.01); *H03H 9/542* (2013.01); *H03H 9/64* (2013.01); *H03H 9/706* (2013.01); *H03H 9/0057* (2013.01)

(58) Field of Classification Search
    CPC .......... H03H 9/725; H03H 9/706; H03H 9/64; H03H 9/542; H03H 9/0057
    (Continued)

(56) References Cited

U.S. PATENT DOCUMENTS 7,583,161 B2 *   9/2009   Tanaka ................. H03H 9/0576
                                                       333/133
8,587,389 B2 *   11/2013   Koga ................... H03H 9/0576
                                                       333/133

(Continued)

FOREIGN PATENT DOCUMENTS

JP     9-167937 A     6/1997
JP     2010-154437 A     7/2010

(Continued)

OTHER PUBLICATIONS

Official Communication issued in International Application PCT/JP2014/066228, dated Sep. 9, 2014.

*Primary Examiner* — Robert J Pascal
*Assistant Examiner* — Jorge Salazar, Jr.
(74) *Attorney, Agent, or Firm* — Keating & Bennett, LLP

(57) ABSTRACT

In a high-frequency module, a phase and amplitude of a high-frequency signal from a connection conductor between filter devices change due to the signal being transmitted by a takeout circuit unit. When the high-frequency signal at a third external connection terminal is a suppression signal and a high-frequency signal passing through the first filter circuit is a suppression-target signal, the transmission distance in the takeout circuit unit is such that the phase of the suppression signal is approximately inverted with respect to the phase of the suppression-target signal and the suppression signal has approximately the same amplitude as the suppression-target signal. The suppression signal is mixed with the suppression-target signal and components outside of the pass band are cancelled out and the attenuation characteristics of the filter circuit are enhanced.

18 Claims, 10 Drawing Sheets

(51) Int. Cl.
*H03H 9/64* (2006.01)
*H03H 9/70* (2006.01)
*H03H 9/00* (2006.01)

(58) Field of Classification Search
USPC ......................................................... 333/133
See application file for complete search history.

(56) References Cited

U.S. PATENT DOCUMENTS

| | | | |
|---|---|---|---|
| 2010/0026419 A1* | 2/2010 | Hara | H03H 9/0028 333/175 |
| 2010/0150075 A1* | 6/2010 | Inoue | H03H 9/725 370/328 |
| 2010/0244979 A1 | 9/2010 | Matsuda et al. | |
| 2011/0221546 A1* | 9/2011 | Yamaji | H03H 9/1071 333/193 |
| 2011/0254639 A1 | 10/2011 | Tsutsumi et al. | |
| 2012/0119847 A1 | 5/2012 | Iwaki et al. | |
| 2013/0099628 A1 | 4/2013 | Inoue et al. | |

FOREIGN PATENT DOCUMENTS

| | | |
|---|---|---|
| JP | 2012-70098 A | 4/2012 |
| JP | 2012-109818 A | 6/2012 |
| WO | 2010/073377 A1 | 7/2010 |

* cited by examiner

HIGH-FREQUENCY MODULE

BACKGROUND OF THE INVENTION

1. Field of the Invention

The present invention relates to a high-frequency module including a plurality of filter devices.

2. Description of the Related Art

A mobile apparatus and the like having a wireless communication function includes a filter circuit for passing a high-frequency signal with a desired frequency and attenuating high-frequency signals having frequencies other than the desired frequency.

For example, Japanese Unexamined Patent Application Publication No. 2012-109818 discloses a filter circuit including a plurality of resonators. Specifically, in the filter circuit of Japanese Unexamined Patent Application Publication No. 2012-109818, a plurality of resonators are connected in series between an input terminal and an output terminal.

In the configuration disclosed in Japanese Unexamined Patent Application Publication No. 2012-109818, a path (hereinafter, called a compensation circuit) including an inductor or an inductor and a capacitor is connected in parallel with the filter circuit to improve attenuation characteristics outside of a pass band. The compensation circuit is adjusted such that a suppression signal propagating through the compensation circuit has the same amplitude as a high-frequency signal (suppression-target signal) outside of the pass band passing through the filter circuit and has a phase opposite to that of the high-frequency signal. As a result, the suppression-target signals cancel each other out at a connection node between the filter circuit and the compensation circuit and are not output from the output terminal.

However, with the above-described configuration in a high-frequency module, the compensation circuit is provided outside of the filter circuit, thus causing an increase in the size of the module.

Further, the outside of the filter circuit is likely to be influenced by the external environment. Specifically, the compensation circuit, which is likely to be influenced by noise outside of the filter circuit, is likely to couple with other circuits. Further, the compensation circuit is likely to be influenced by coupling between mounted devices outside of the filter circuit. As a result, the high-frequency module will have variations in the characteristics, whereby it becomes difficult to make the attenuation characteristics be desired characteristics.

SUMMARY OF THE INVENTION

Preferred embodiments of the present invention provide a high-frequency module including a small filter circuit with excellent attenuation characteristics outside of a pass band.

A high-frequency module according to a preferred embodiment of the present invention includes a first external connection terminal to which a high-frequency signal is input; a second external connection terminal outputting a high-frequency signal; and a high-frequency signal processing unit connected between the first external connection terminal and the second external connection terminal.

The high-frequency signal processing unit includes a first filter circuit including a plurality of filter devices connected in series between the first external connection terminal and the second external connection terminal; and a takeout circuit unit one end of which is connected directly or through electromagnetic field coupling with a connection conductor connected to one of the plurality of filter devices of the first filter circuit and the other end of which is a third external connection terminal. The third external connection terminal is connected to the second external connection terminal.

The electromagnetic field coupling is realized by inductive coupling or capacitive coupling. For example, one end of the takeout circuit unit is connected through inductive or capacitive coupling with a connection conductor connecting the filter devices to each other. As a result, a high-frequency signal flowing through the filter devices is distributed and transmitted toward the third external connection terminal. Note that the one end of the takeout circuit unit may be directly connected to the connection conductor between the filter devices (for example, resistor distribution). Further, the one end of the takeout circuit unit may be connected, for example, to a connection conductor connecting the first external connection terminal to a filter device, not limited to the connection conductor connecting the filter devices to each other.

As a result of the distributed high-frequency signal being transmitted by the takeout circuit unit, the phase and amplitude of the signal change. For example, the phase periodically changes and the amplitude is decreased due to loss in the takeout circuit unit, in accordance with the transmission distance.

When the high-frequency signal at the third external connection terminal is called a suppression signal and the high-frequency signal passing through the first filter circuit is called a suppression-target signal, for example, the transmission distance in the takeout circuit unit is set such that the phase of the suppression signal is approximately inverted with respect to the phase of the suppression-target signal and the suppression signal has the same or approximately the same amplitude as the suppression-target signal.

The suppression signal is mixed with the suppression-target signal as a result of the third external connection terminal and the second external connection terminal are connected to each other. Then, components outside of the pass band are cancelled out as a result of the suppression signal and the suppression-target signal being mixed, at the connection portion between the third external connection terminal and the second external connection terminal. Hence, the attenuation characteristics are enhanced.

The takeout circuit unit is provided within the high-frequency signal processing unit and, hence, is unlikely to be influenced by the external environment. As a result, the high-frequency module is unlikely to have variations in characteristics and allows easy adjustment of the attenuation characteristics.

The third external connection terminal may be directly connected to the second external connection terminal, or a configuration may be included in which the third external connection terminal is connected to the second external connection terminal through inductive coupling or capacitive coupling connection.

A configuration may be included in which a matching device is provided between the second external connection terminal and the third external connection terminal.

The matching device performs final adjustment of the phase of the suppression signal and, hence, components of the suppression-target signal outside of the pass band are further cancelled out.

The matching device may be a capacitor or an inductor, and may be a line conductor.

When the matching device is a line conductor, the phase of the suppression signal is able to be adjusted in accordance with the length of the line conductor. In this case, the amplitude of the suppression signal is also able to be adjusted in accordance with the length of the line conductor.

The matching device may be set such that a phase of a high-frequency signal is inverted in a band outside of a pass band of the first filter circuit.

When the phase of the suppression signal is inverted (180°) in the outside of the pass band with respect to the phase of the suppression-target signal, most of the components outside of the pass band are cancelled out.

The high-frequency module is a duplexer including a second filter circuit, one end of the second filter circuit is connected to the second external connection terminal, and the other end of the second filter circuit is connected to a fourth external connection terminal.

For example, when the attenuation characteristics of the transmission-side first filter circuit are enhanced, components which leak to the reception-side second filter circuit are decreased. As a result, isolation between a transmission circuit connected to the first external connection terminal and a receiver circuit connected to the fourth external connection terminal is enhanced.

A high-frequency module according to another preferred embodiment of the present invention may have the following configuration.

The high-frequency module further includes: a plate-shaped filter substrate on a first main surface of which a plurality of IDT electrodes defining the plurality of filter devices are located; a plate-shaped cover layer facing the first main surface of the filter substrate with a space therebetween; a plurality of connection electrodes protruding from the first main surface and extending through the cover layer; and a multilayer substrate. The first main surface faces a mounting surface of the multilayer substrate, and the filter substrate is connected to the multilayer substrate with the plurality of connection electrodes interposed therebetween.

With this configuration, the high-frequency signal processing unit is realized so as to have a wafer level package (WLP) structure. This allows the high-frequency module to be reduced in size.

The takeout circuit unit may be provided on the first main surface of the filter substrate or within the filter substrate, and at least one connection electrode of the plurality of connection electrodes may be the third external connection terminal.

The takeout circuit unit may be provided on a surface of the cover layer or inside the cover layer, and at least one connection electrode of the plurality of connection electrodes may be the third external connection terminal.

One end of the takeout circuit unit may be directly connected to the connection conductor of the first filter circuit.

With the WLP structure, the takeout circuit unit and the third external connection terminal are able to be provided in the region of the filter substrate when the high-frequency module is viewed in plan and, hence, the high-frequency module is able to be reduced in size.

One end of the takeout circuit unit may be arranged so as to be superposed with the connection conductor when viewed in plan in a direction normal to the first main surface.

With this configuration, a high-frequency signal is extracted as a result of the one end of the takeout circuit unit being inductively or capacitively coupled with one of conductors which connect the plurality of IDT electrodes on the first main surface of the filter substrate to one another.

The high-frequency module may have the following configuration.

The high-frequency module includes: a plate-shaped filter substrate with a first main surface that includes a plurality of IDT electrodes located thereon which define the plurality of filter devices, a multilayer substrate, and a plurality of connection electrodes protruding from the first main surface and being connected to the multilayer substrate. The first main surface faces a mounting surface of the multilayer substrate, and the filter substrate is enclosed by a resin film.

With this configuration, the high-frequency signal processing unit is realized so as to have a bare chip structure.

A configuration may be included in which the takeout circuit unit is provided on the first main surface of the filter substrate or within the filter substrate, and at least one connection electrode among the plurality of connection electrodes is the third external connection terminal.

A configuration may be included in which the takeout circuit unit is provided within the filter substrate, at least one connection electrode among the plurality of connection electrodes is the third external connection terminal, and one end of the takeout circuit unit is superposed with the connection conductor when viewed in plan in a direction normal to the first main surface.

The high-frequency module may have the following configuration. The high-frequency module includes: a plate-shaped filter substrate on a first main surface of which a plurality of IDT electrodes defining the plurality of filter devices are formed; and a plate-shaped filter mounting substrate which is arranged on the first main surface side of the filter substrate and on which the first main surface side of the filter substrate is mounted.

With this configuration, the high-frequency signal processing unit is realized so as to have a chip sized package (CSP) structure. In addition, a CSP structure allows the matching device to be mounted on the filter mounting substrate.

According to various preferred embodiments of the present invention, a high-frequency module including a small filter circuit with excellent attenuation characteristics outside of a pass band is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
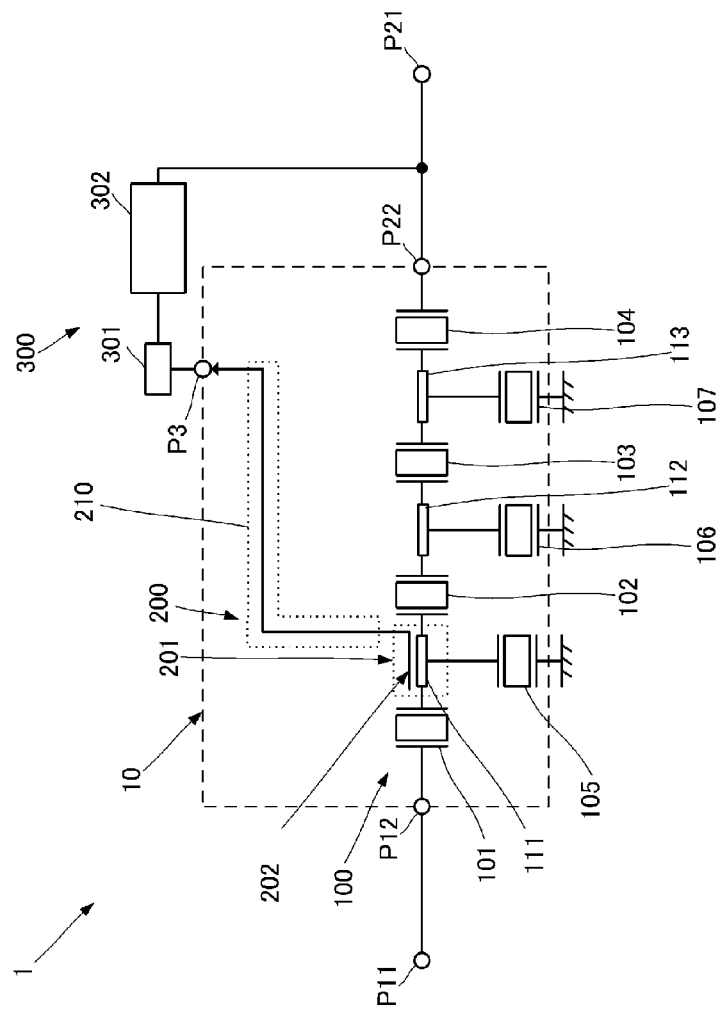
FIG. 1 is a circuit block diagram illustrating a first circuit example of a high-frequency module according to a first preferred embodiment of the present invention.

High-frequency modules according to preferred embodiments of the present invention will be described with reference to the drawings. FIG. 1 is a circuit block diagram illustrating a first circuit example of a high-frequency module according to a first preferred embodiment of the present invention.

The high-frequency module 1 includes a first external connection terminal P11, a second external connection terminal P21, a high-frequency signal processing unit 10, and an external circuit 300.

The high-frequency signal processing unit 10 is connected between the first external connection terminal P11 and the second external connection terminal P21.

A high-frequency signal in, for example, an 800 MHz band is input to the first external connection terminal P11. The second external connection terminal P21 outputs a high-frequency signal.

The high-frequency signal processing unit 10 includes a first terminal P12, a second terminal P22, a third terminal P3 (corresponding to a "third external connection terminal"), a filter circuit 100 (corresponding to a first filter circuit), and a takeout circuit 200. The high-frequency signal processing unit 10 includes a single substrate. In other words, the filter circuit 100 and the takeout circuit 200 are preferably provided in the same substrate in the first preferred embodiment.

The first terminal P12 is connected to the first external connection terminal P11. The second terminal P22 is connected to the second external connection terminal P21.

The filter circuit 100 is connected between the first terminal P12 and the second terminal P22.

The filter circuit 100 includes a plurality of SAW (surface acoustic wave) resonators 101, 102, 103, and 104 (hereinafter, simply called the plurality of SAW resonators 101 to 104, when the plurality of SAW resonators are described together). These plurality of SAW resonators correspond to a "plurality of filter devices". The filter circuit 100 includes a plurality of SAW resonators 105, 106, and 107. Note that the number of the SAW resonators and their arrangement may be appropriately changed to obtain the frequency band of a signal to be allowed to pass therethrough and desired attenuation characteristics outside of the pass band.

The plurality of SAW resonators 101 to 104 and the plurality of SAW resonators 105, 106, and 107 each have an individual resonant frequency and each define and function as a band pass filter (BPF) having individual bandpass characteristics. The plurality of SAW resonators 101 to 104 are connected in series between the first terminal P12 and the second terminal P22. The plurality of SAW resonators 105, 106, and 107 are connected between the ground and respective connection conductors connecting neighboring SAW resonators among the plurality of SAW resonators 101 to 104.

More specifically, one end of the SAW resonator 101 is connected to the first terminal P12. The other end of the SAW resonator 101 is connected to one end of the SAW resonator 102 with a connection conductor 111 interposed therebetween. One end of the SAW resonator 105 is connected to the connection conductor 111, and the other end of the SAW resonator 105 is connected to the ground.

The other end of the SAW resonator 102 is connected to one end of the SAW resonator 103 with a connection conductor 112 interposed therebetween. One end of the SAW resonator 106 is connected to the connection conductor 112 and the other end of the SAW resonator 106 is connected to the ground.

The other end of the SAW resonator 103 is connected to one end of the SAW resonator 104 with a connection conductor 113 interposed therebetween. One end of the SAW resonator 107 is connected to the connection conductor 113, and the other end of the SAW resonator 107 is connected to the ground.

The other end of the SAW resonator 104 is connected to the second terminal P22.

The filter circuit 100 realizes desired bandpass characteristics for the filter circuit 100 through a combination of the bandpass characteristics and the attenuation characteristics outside of the pass bands of the plurality of SAW resonators 101 to 104 and the plurality of SAW resonators 105, 106, and 107. As a result, the high-frequency module 1 outputs a high-frequency signal in a desired pass band B (for example, a center frequency $f_0$ is 800 MHz) among high-frequency signals input to the first external connection terminal P11 from the second external connection terminal P21.

Next, the configurations of the takeout circuit 200 and the external circuit 300 will be described. In the first circuit example, the high-frequency module 1 includes the takeout circuit 200 and the external circuit 300 to improve attenuation characteristics outside of the desired pass band B. However, the external circuit 300 is not an essential configuration of the preferred embodiments of the present invention.

The takeout circuit 200 preferably includes a distributor 201 and a main line 210. One end of the main line 210 is connected to the distributor 201. The other end of the main line 210 is connected to the third terminal P3.

The distributor 201 distributes a high-frequency signal from the connection conductor 111 and outputs the high-frequency signal to the main line 210. An internal conductor 202 within the distributor 201 and the connection conductor 111 are capacitively coupled or inductively coupled with each other in an insulated state. In other words, the internal conductor 202 within the distributor 201 and the connection conductor 111 are connected to each other through electromagnetic field coupling. However, the distribution of a high-frequency signal may be realized in a manner in which a high-resistance resistor or the like is directly connected to the connection conductor 111, as illustrated in other circuit examples.

Note that in the example described above, an example has been illustrated in which a high-frequency signal is extracted from the connection conductor 111; however, in accordance with required characteristics, a configuration may be included in which a high-frequency signal is extracted from other connection conductors such as the connection conductors 112 and 113 illustrated in FIG. 1. For example, a high-frequency signal may be extracted from a connection conductor connecting the first terminal P12 to the SAW resonator 101, a connection conductor connecting the SAW resonator 104 to the second terminal P22, a connection conductor connecting the connection conductor 111 to the SAW resonator 105, a connection conductor connecting the connection conductor 112 to the SAW resonator 106, a connection conductor connecting the connection conductor 113 to the SAW resonator 107, or the like.

The frequency and amplitude of a high-frequency signal extracted by the distributor 201 are adjusted by adjusting the connection manner and the coupling degree between the internal conductor 202 of the distributor 201 and the connection conductor 111.

The main line 210 is a line conductor having a predetermined length, as illustrated in FIG. 1, for example. The main line 210 transmits a high-frequency signal distributed by the distributor 201. The phase and amplitude of a high-frequency signal change, when the signal is transmitted by the main line 210. The length of the main line 210 is set such that a high-frequency signal extracted from the third terminal P3 has a desired phase and the high-frequency signal has a desired amplitude.

The external circuit 300 includes a connector 301 and a phase matching unit 302. The connector 301 is connected to the third terminal P3. The phase matching unit 302 is connected between the connector 301 and the second external connection terminal P21. The phase matching unit 302 includes an inductor or a capacitor, or a line conductor, and the inductor or capacitor, or line conductor is used to adjust the phase of a high-frequency signal.

Next, the operation of the takeout circuit 200 and the external circuit 300 will be explained. In the high-frequency module 1 of the present preferred embodiment, the attenuation characteristics of the filter circuit 100 are improved, through adjustment of the connection manner and coupling degree of the distributor 201, by adjusting the frequency and amplitude of an extracted high-frequency signal and as a result of the main line 210 adjusting the amount of change in the phase and amplitude of the high-frequency signal.

More specifically, the operation of the main line 210 will be described by assuming that a suppression-target signal $HS_1$ is a high-frequency signal output from the second terminal P22 through the filter circuit 100 and a takeout signal $HS_2$ is a high-frequency signal distributed by the distributor 201.

It is assumed that an amplitude $A_1$ is the amplitude of the suppression-target signal $HS_1$ at a frequency $f_1$ (the frequency $f_1$ is a frequency outside of the pass band B of the filter circuit 100), and a phase $PH_1$ is the phase of the suppression-target signal HS' with the frequency $f_1$ at the second terminal P22.

The distributor 201 extracts the takeout signal $HS_2$ having the frequency $f_1$ from the connection conductor 111 as a result of the connection manner and coupling degree between the distributor 201 and the connection conductor 111 being adjusted. The length of the main line 210 is set such that the amplitude of the takeout signal $HS_2$ at the frequency $f_1$ is an amplitude $A_2$ and the phase at the third terminal $P_3$ is a phase $PH_2$. The amplitude $A_2$ is set so as to be about the same as the amplitude $A_1$. The phase $PH_2$ is set so as to be nearly opposite to the phase $PH_1$. Hereinafter, the high-frequency signal in which the amount of change in the amplitude and phase has been adjusted by the main line 210 is called a suppression signal $HS_3$. The suppression signal $HS_3$ is output from the third terminal $P_3$ to the external circuit 300.

The suppression signal $HS_3$ is input to the phase matching unit 302 through the connector 301. The phase matching unit 302 corrects the phase of the suppression signal $HS_3$. In other words, the phase of the suppression signal $HS_3$, which was not completely corrected by the main line 210, is corrected by final adjustment performed by the phase matching unit 302 so as to be inverted (180°) with respect to the phase $PH_1$. The high-frequency signal which has been subjected to the final adjustment by the phase matching unit 302 is called a suppression signal $HS_4$. The suppression signal $HS_4$ is output from the phase matching unit 302 to the second external connection terminal P21. Then, the suppression-target signal HS' and the suppression signal $HS_4$ are mixed at the second external connection terminal P21.

Note that, strictly speaking, a path from the second terminal P22 to the second external connection terminal P21 and a path from the phase matching unit 302 to the second external connection terminal P21 also cause the phase and amplitude of a high-frequency signal to change. However, in the present preferred embodiment, description is made assuming that the lengths of these paths are negligibly small and, hence, the phase and amplitude do not change due to these paths. Alternatively, the distributor 201 and the main line 210 may be set by taking into consideration these lengths of the paths in advance.

The suppression-target signal $HS_1$ and the suppression signal $HS_4$ have the same amplitude $A_1$ and opposite phases at the frequency $f_1$ and, hence, the components of the frequency $f_1$, when mixed, are cancelled out. In other words, at the frequency $f_1$ outside of the pass band B of the filter circuit 100, the component outside of the pass band of the suppression-target signal $HS_1$ is sufficiently attenuated by the suppression signal $HS_4$.

The main line 210 is provided together with the filter circuit 100 on a substrate on which the high-frequency signal processing unit 10 is formed. Hence, compared with the case in which the main line 210 is located outside of the substrate, the main line 210 is unlikely to be influenced by noise and unlikely to be coupled with other circuits formed outside of the substrate. Further, the main line 210 is unlikely to be influenced by coupling among devices arranged outside of the substrate, compared with the case in which the main line 210 is located outside of the substrate. As a result, the setting of the length of the main line 210 to adjust the amount of change in the amplitude and phase of a high-frequency signal is simplified since variations due to the influence from the external environment are reduced. Further, the main line 210 is able to be formed within the substrate using semiconductor micro fabrication with small manufacturing variations. Hence, the manufacturing variations of the main line 210 are also small.

The takeout signal $HS_2$, which is extracted by the distributor 201 through inductive coupling or capacitive coupling, has a low level compared with a high-frequency signal flowing through the connection conductor 111. Hence, the takeout signal $HS_2$ is able to be decreased so as to have the desired amplitude $A_1$ by only the main line 210 which is a line conductor.

Since the amount of change in the amplitude and phase of a high-frequency signal is able to be adjusted by the main line 210, the external circuit 300, even with a simple configuration, is able to perform sufficient final adjustment of the suppression signal $HS_3$. In other words, as a result of the takeout circuit 200 being provided in the high-frequency module 1, the external circuit 300 is able to be reduced in size. Further, the high-frequency module 1 achieves controlled characteristics since the external circuit 300, which is likely to be influenced by noise, is able to be reduced in size.

Note that a configuration may be included in which the phase is adjusted not only by the main line 210 but also by a capacitor or an inductor provided on the main line 210.

Although the third terminal P3 and the second external connection terminal P21 are connected to each other with the external circuit 300 interposed therebetween in the first circuit example, they may be directly connected to each other. For example, the third terminal P3 may be directly connected to the second terminal P22 by using a wiring line within the substrate. Also in this case, the suppression signal $HS_3$ whose amplitude and phase have been adjusted by the main line 210 is able to cancel out a component at the frequency $f_1$ of the suppression-target signal $HS_1$. The high-frequency module 1 which does not include the external circuit 300 is thus able to be further reduced in size.

The takeout circuit 200 of the present preferred embodiment is also applicable to the filter circuit 100 which includes a plurality of longitudinally coupled resonators.

Further, when even the adjustment of the attenuation characteristics performed by the main line 210 is not needed in the filter circuit 100, the third terminal $P_3$ may be connected to the ground.

Figure 2:
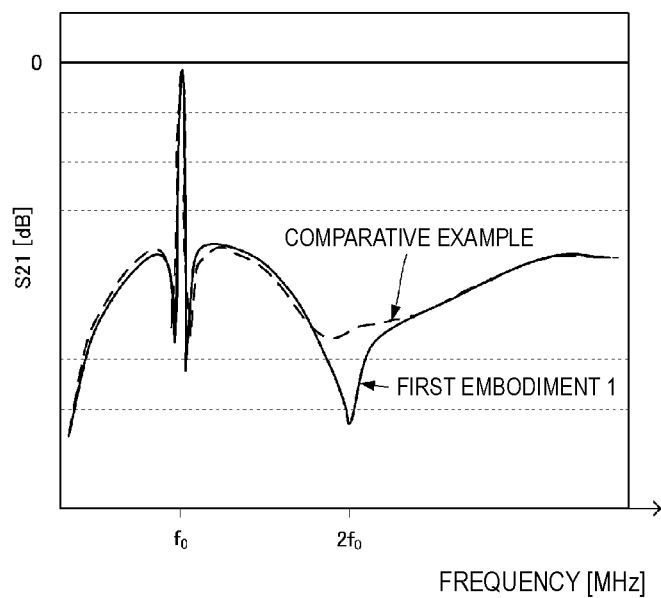
FIG. 2 is a schematic diagram illustrating the bandpass characteristics of the high-frequency module according to the first preferred embodiment of the present invention.

FIG. 2 is a schematic diagram illustrating the bandpass characteristics in the first circuit example. The vertical axis in FIG. 2 represents the bandpass characteristics for a high-frequency signal propagating from the first external connection terminal P11 to the second external connection terminal P21. The horizontal axis in FIG. 2 represents a frequency. The solid line in FIG. 2 shows the bandpass characteristics of the high-frequency module 1. The dotted line in FIG. 2 shows the bandpass characteristics of the comparative example. Note that it is assumed that the first circuit example and the comparative example are placed in the same environment.

The comparative example is an example in which a high-frequency signal is directly extracted from the first external connection terminal P11 and input to the external circuit. In this case, due to influence from the external environment, the attenuation characteristics in the comparative example are degraded as illustrated in FIG. 2. Further, in the comparative example, the amplitude and phase of the suppression signal used to improve the attenuation characteristics of the filter circuit 100 need to be adjusted using only the external circuit. Hence, the external circuit in the comparative example will have a complex configuration and an increased size. As a result, the high-frequency signal in the external circuit is likely to be influenced by noise, thus causing variations in the attenuation characteristics.

However, in the high-frequency module 1, the suppression signal $HS_3$ is generated within a substrate where influence of noise is unlikely, as described above. As a result, in the high-frequency module 1, adjustment to obtain desired characteristics is simplified and the characteristics are unlikely to vary. Referring to FIG. 2, in the present preferred embodiment, the high-frequency module 1 allows attenuation at frequency $2f_0$ which is twice the center frequency $f_0$ among frequencies outside of the pass band B to be increased more than in the comparative example.

Note that by appropriately adjusting the connection manner and coupling degree between the internal conductor 202 and the connection conductor 111 of the distributor 201, more attenuation is realized than in the comparative example, also in a frequency band other than the frequency $2f_0$ outside of the pass band B, as described above.

Further, the high-frequency module 1 allows the frequency of an attenuation pole, i.e., the frequency $2f_0$ of the double wave to be adjusted by changing the connection manner and coupling degree between the internal conductor 202 and the connection conductor 111 in the distributor 201.

Figure 3:
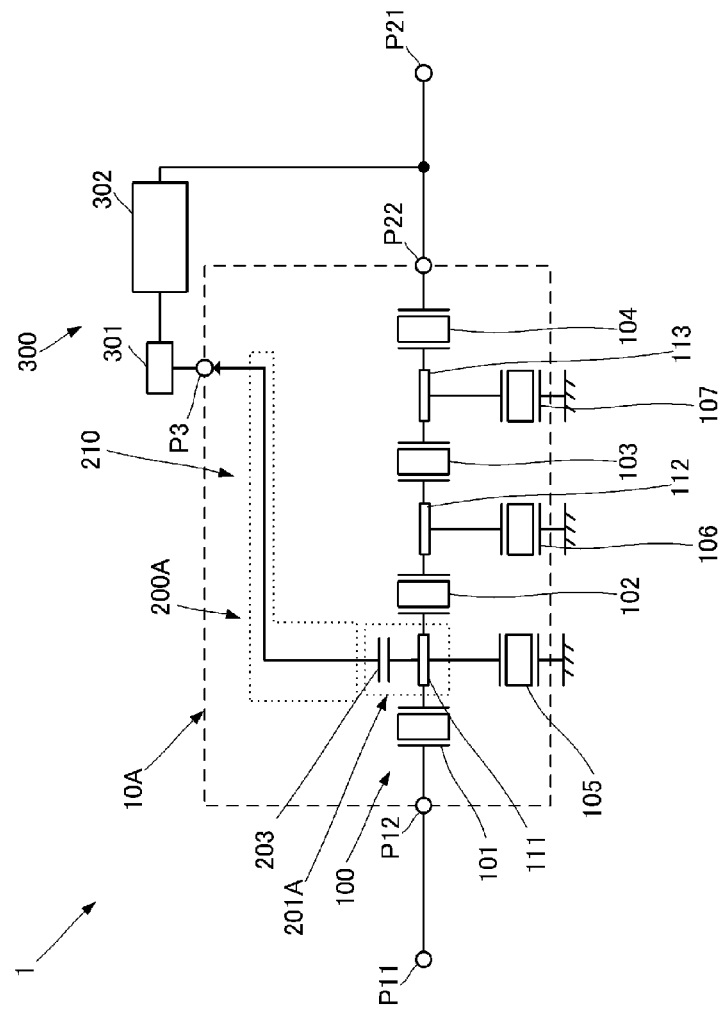
FIG. 3 is a circuit block diagram illustrating a second circuit example of the high-frequency module according to the first preferred embodiment of the present invention.
Figure 4:
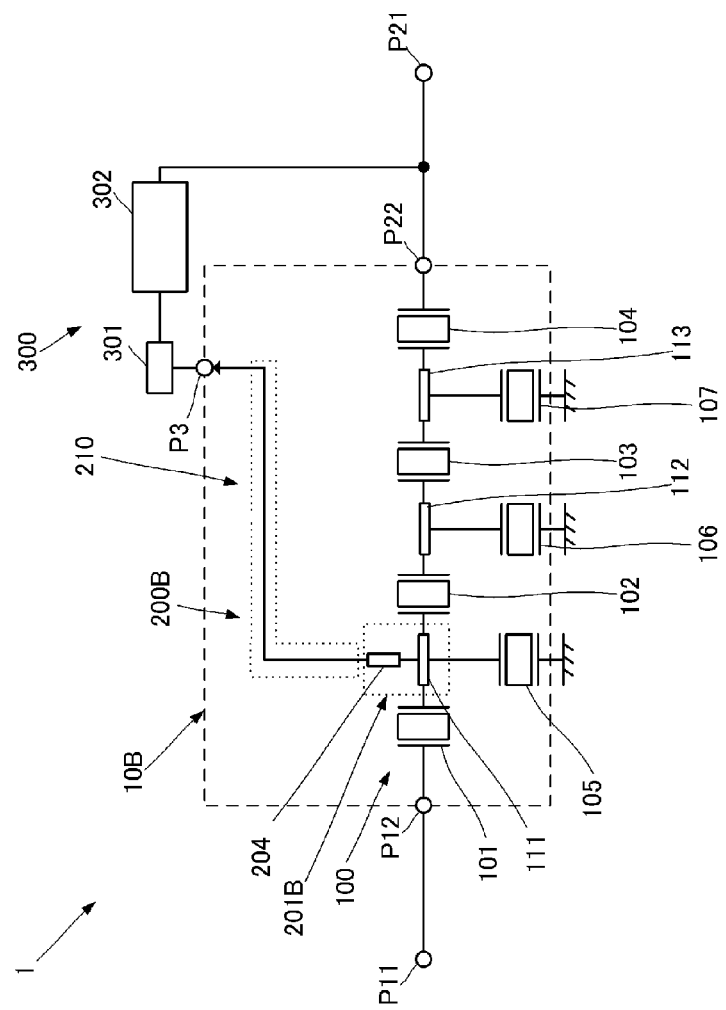
FIG. 4 is a circuit block diagram illustrating a third circuit example of the high-frequency module according to the first preferred embodiment of the present invention.

Next, the connection manner of the distributor will be described using a second circuit example and a third circuit example. FIG. 3 is a circuit block diagram illustrating the second circuit example of the high-frequency module 1 according to the first preferred embodiment. FIG. 4 is a circuit block diagram illustrating the third circuit example of the high-frequency module 1 according to the first preferred embodiment.

The second circuit example and the third circuit example are different from the first circuit example in terms of the connection manner of the distributor. The descriptions of configurations which are the same as those of the first circuit example are omitted.

The high-frequency module 1 illustrated in the second circuit example includes the first external connection terminal P11, the second external connection terminal P21, a high-frequency signal processing unit 10A, and the external circuit 300. The high-frequency signal processing unit 10A includes the first terminal P12, the second terminal P22, the third terminal P3, the filter circuit 100, and a takeout circuit 200A. The takeout circuit 200A includes a distributor 201A, and the main line 210.

The distributor 201A includes a capacitor 203. One end of the capacitor 203 is directly connected to the connection conductor 111. The other end of the capacitor 203 is directly connected to the main line 210.

With the configuration described above, the distributor 201A extracts a high-frequency signal flowing through the connection conductor 111.

The high-frequency module 1 illustrated in the third circuit example includes the first external connection terminal P11, the second external connection terminal P21, a high-frequency signal processing unit 10B, and the external circuit 300. The high-frequency signal processing unit 10B includes the first terminal P12, the second terminal P22, the third terminal P3, the filter circuit 100, and a takeout circuit 200B. The takeout circuit 200B includes a distributor 201B and the main line 210. The descriptions of configurations which are the same as those of the first circuit example are omitted.

The distributor 201B includes a resistor 204. One end of the resistor 204 is directly connected to the connection conductor 111. The other end of the resistor 204 is directly connected to the main line 210.

With the configuration described above, the distributor 201B extracts a high-frequency signal flowing through the connection conductor 111.

Figure 5:
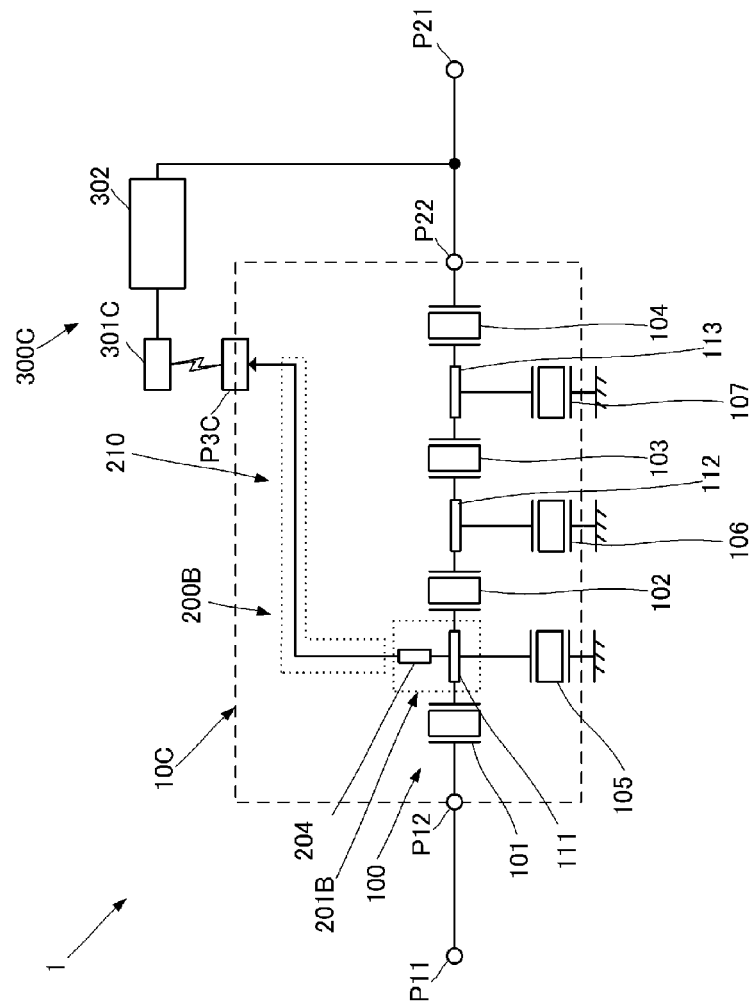
FIG. 5 is a circuit block diagram illustrating a fourth circuit example of the high-frequency module according to the first preferred embodiment of the present invention.

Next, FIG. 5 is circuit block diagram illustrating a fourth circuit example of the high-frequency module 1 according to the first preferred embodiment.

The fourth circuit example is different from the third circuit example in terms of the manner in which the takeout circuit and the external circuit are connected to each other. The descriptions of configurations which are the same as those in the third circuit example will be omitted.

The high-frequency module 1 illustrated in the fourth circuit example includes the first external connection terminal P11, the second external connection terminal P21, a high-frequency signal processing unit 10C, and an external circuit 300C. The high-frequency signal processing unit 10C includes the first terminal P12, the second terminal P22, a third terminal P3C, the filter circuit 100, and the takeout circuit 200B.

The external circuit 300C includes a connector 301C and the phase matching unit 302.

Each of the third terminal P3C and the connector 301C includes therein a capacitor or an inductor. The third terminal P3C and the connector 301C are arranged close to each other. Then, the connector 301C is capacitively coupled with or inductively coupled with the third terminal P3C, thus receiving a high-frequency signal from the third terminal P3C.

Figure 6:
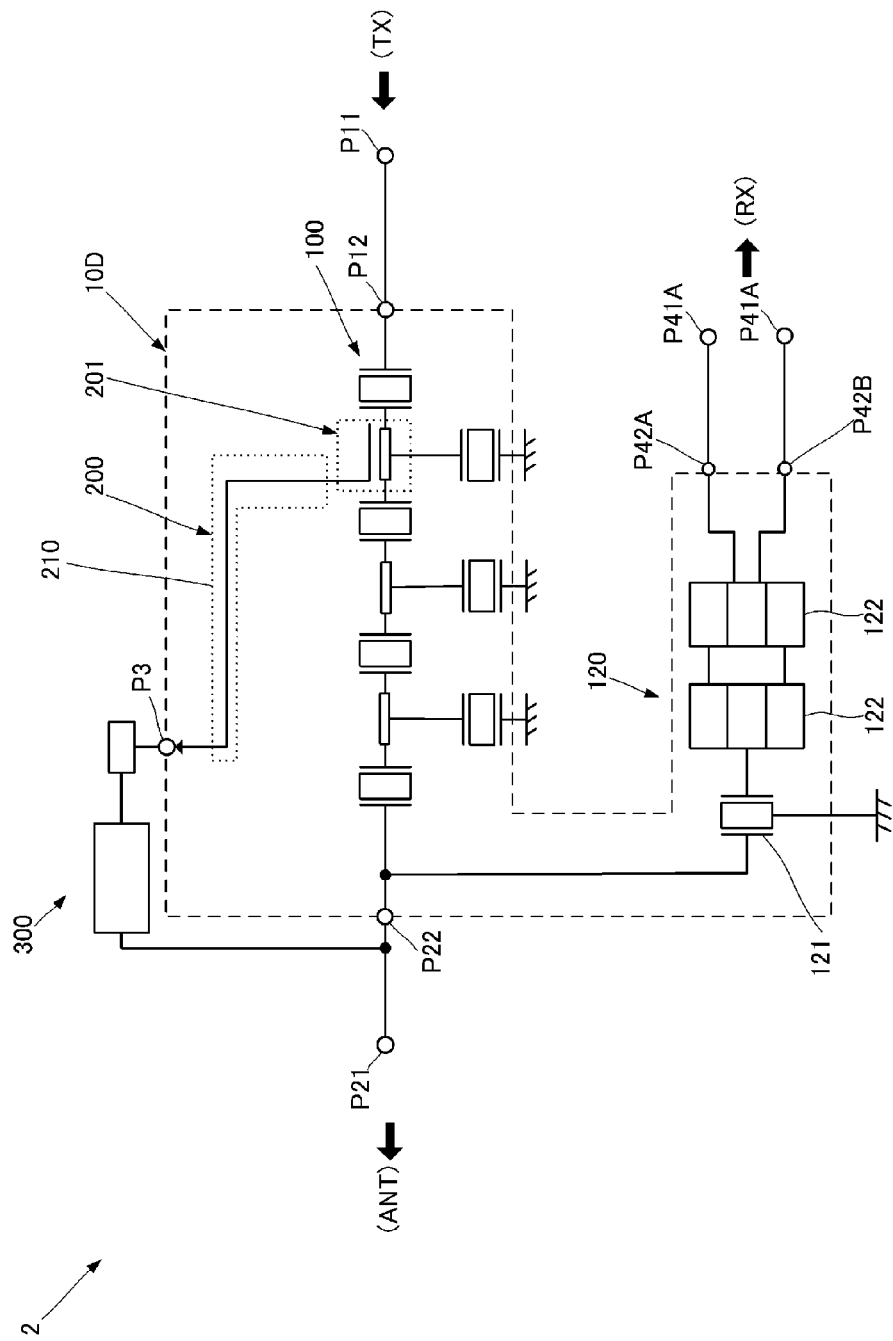
FIG. 6 is a circuit block diagram illustrating a circuit example of a duplexer 2 according to a second preferred embodiment of the present invention.

Next, as a specific application example, the high-frequency module 1 according to the first preferred embodiment preferably is used in a duplexer configuration illustrated in FIG. 6. FIG. 6 is a circuit block diagram illustrating a circuit example of a duplexer 2 according to a second preferred embodiment of the present invention.

The duplexer 2 includes the first external connection terminal P11, the second external connection terminal P21, fourth external connection terminals P41A and P41B, a high-frequency signal processing unit 10D, and the external circuit 300. Descriptions of the configurations which are the same as those in the first, second, and third circuit examples will be omitted.

As a specific application example, the first external connection terminal P11 is connected to a transmission circuit. The second external connection terminal P21 is connected to an antenna.

The high-frequency signal processing unit 10D includes the first terminal P12, the second terminal P22, the third terminal P3, the filter circuit 100, the takeout circuit 200, a filter circuit 120 (corresponding to the second filter circuit), and two fourth terminals P42A and P42B. The high-frequency signal processing unit 10D includes the filter circuit 100, the takeout circuit 200A, and the filter circuit 120 in the same substrate.

The filter circuit 120 is connected between the second terminal P22 and the fourth terminals P42A and P42B.

In the filter circuit 120, a SAW resonator 121, and longitudinally coupled resonators 122 and 123 are connected in series. With this configuration, the filter circuit 120 realizes desired second bandpass characteristics and second attenuation characteristics outside of a second pass band, between the second terminal P22 and the fourth terminals P42A and P42B, by combining the bandpass characteristics and attenuation characteristics of the SAW resonators 121, 122, and 123. The second pass band is set to be a frequency band different from the first pass band B of the filter circuit 100, and within the attenuation band outside of the first pass band B.

The fourth terminals P42A and P42B are connected to a receiver circuit with fourth external connection terminals P41A and P41B respectively interposed therebetween.

With the configuration described above, the filter circuit 100 and the filter circuit 120 define and function as a duplexer with the second terminal P22 as a common terminal and the first terminal P12 and the fourth terminals P42A and P42B as individual terminals.

As described above, the frequency of an attenuation pole can be adjusted by changing the connection manner and coupling degree of the distributor 201 and the length of the main line 210. By utilizing this, the filter circuit 100 is adjusted such that the attenuation in the second pass band is increased. Then, the component of the second pass band leaking to the filter circuit 120 side is reduced in a high-frequency transmission signal output from the first terminal P12 to the second external connection terminal P21. Hence, the duplexer 2 is able to enhance isolation between the transmission circuit and receiver circuit.

The high-frequency module 1 and the duplexer 2 having the configurations described above are able to be realized with the following respective structures. Note that, hereinafter, an example realizing the structure of the duplexer 2 will be shown.

Figure 7A:
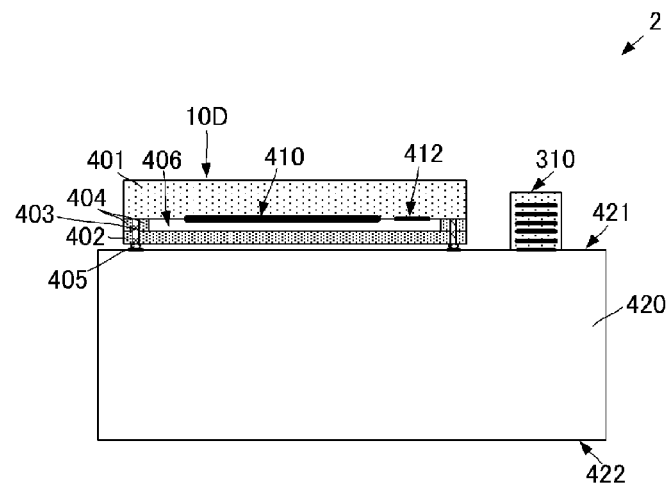
FIGS. 7A and 7B illustrate a conceptual side view of a WLP-mounted duplexer 2 and a top view of a filter substrate 401.

FIG. 7A is a conceptual side view illustrating the main structure of the duplexer 2. The duplexer 2 includes a multilayer substrate 420, a filter substrate 401, a cover layer 402, a plurality of connection electrodes 403, a side cover layer 404, a plurality of mounting electrodes 405, and a surface-mount circuit device 310.

The multilayer substrate 420 is formed preferably by stacking a plurality of dielectric layers on top of one another. Electrodes with predetermined patterns are formed and wiring patterns for the high-frequency module 1 except for the high-frequency signal processing unit 10D are formed, on a top surface 421 and the inner layers of the multilayer substrate 420. External connection electrodes (not illustrated) are formed on a bottom surface 422 of the multilayer substrate 420, and these external connection electrodes realize the first external connection terminal P11, the second external connection terminal P21, and the fourth external connection terminals P41A and P41B, described above.

The high-frequency signal processing unit 10D is realized by the filter substrate 401, the cover layer 402, the plurality of connection electrodes 403, the side cover layer 404, and the plurality of mounting electrodes 405.

The filter substrate 401 preferably is a plate-shaped piezoelectric substrate. Filter electrodes are provided on the first main surface of the filter substrate 401. The filter electrodes are formed of, for example, IDT electrodes. By providing the IDT electrodes on the first main surface of the piezoelectric substrate (filter substrate 401) in this manner, the SAW resonators described above are realized. The first main surface of the filter substrate 401 includes electrode patterns located thereon to define the takeout circuit 200 and the connection conductors 111, 112, and 113 of the filter circuit 100. The plate-shaped cover layer 402 is arranged on the first main surface side of the filter substrate 401. The cover layer 402 preferably is a plate-shaped insulating member and has the same shape as the filter substrate 401 in plan view. The cover layer 402 is superposed with the filter substrate 401 in plan view, and so as to be spaced apart from the first main surface of the filter substrate 401 by a predetermined distance.

The side cover layer 404 is arranged between the first main surface of the filter substrate 401 and the cover layer 402. The side cover layer 404 is also made of an insulating material and is disposed, in plan view, over the entire peripheries of the filter substrate 401 and the cover layer 402 in only a region with a predetermined width from the peripheral end toward the inner side. In other words, the cover layer 402 has a frame-shaped structure with an opening in the center.

In this manner, as a result of the cover layer 402 and the side cover layer 404 being arranged, an area where the filter electrodes of the first main surface of the filter substrate 401 are located is arranged in a sealed space 406 formed by the filter substrate 401, the cover layer 402, and the side cover layer 404. With this configuration, the resonant characteristics of the SAW resonators are enhanced and the desired characteristics for a filter is able to be accurately realized.

Each of the plurality of connection electrodes 403 has a shape in which a first end is in contact with the first main surface of the filter substrate 401 and a second end is exposed on the surface of the cover layer 402 farther from the filter substrate 401. The plurality of connection electrodes 403 are formed so as to extend through the side cover layer 404 and the cover layer 402. The first ends of the plurality of connection electrodes 403 are connected to electrode patterns provided on the first main surface of the filter substrate 401.

The plurality of mounting electrodes 405 are respectively connected to the second ends of the connection electrodes 403 and protrude from the surface of the cover layer 402 farther from the filter substrate 401. By providing a plurality of the combinations of the connection electrodes 403 and the respective mounting electrodes 405, the first terminal P12, the second terminal P22, the third terminal P3, and the fourth terminals P42A and P42B of the high-frequency signal processing unit 10D described above are realized. Note that by forming bumps on the second ends of the connection electrodes 403 by using solder, Au, or the like, the connection electrodes 403 may be respectively connected to the mounting electrodes 405 with the bumps interposed therebetween.

By providing the configuration described above, the high-frequency signal processing unit 10D has a wafer level package (WLP) structure, and the high-frequency signal processing unit 10D has a small size.

The high-frequency signal processing unit 10D having a WLP structure is mounted on the top surface (mounting surface) 421 of the multilayer substrate 420. As a result, the high-frequency signal processing unit 10D is connected to the first external connection terminal P11, the second external connection terminal P21, and the fourth external connection terminals P41A and P41B.

The connector 301 of the external circuit 300 is realized as a result of electrodes being provided on the top surface 421 and inner layers of the multilayer substrate 420. The third terminal P3 realized by the combination of the plurality of connection electrodes 403 and the plurality of mounting electrodes 405 is connected to the electrode realizing the connector 301 with a connection line on the top surface 421 or an inner layer of the multilayer substrate 420 interposed therebetween.

The phase matching unit 302 of the external circuit 300 is realized by the surface-mount circuit device 310. Specifically, the surface-mount circuit device 310 includes a casing which is made of an insulating material and is shaped like a rectangular parallelepiped, and electrodes realizing an inductor or a capacitor are provided within the casing.

Connection among the electrode realizing the connector 301, the surface-mount circuit device 310, and the mounting electrodes to define the second external connection terminal P21 is realized by connection lines located on the top surface 421 or inner layers of the multilayer substrate 420.

Figure 7B:
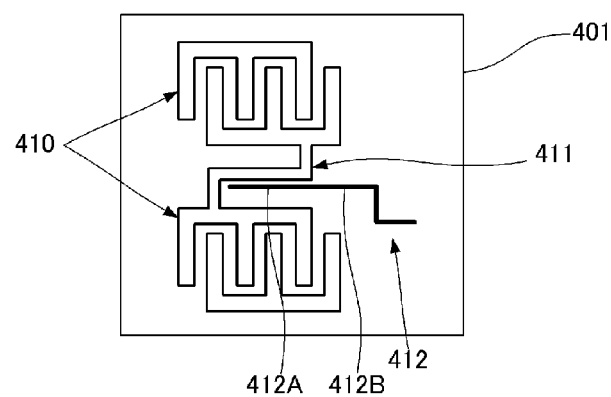

The electrode patterns forming the filter circuit 100 and the filter circuit 120 have the structures illustrated in FIG. 7B, for example. FIG. 7B is a plan view of the filter substrate 401 as seen from the multilayer substrate 420 side. Specifically, on the first main surface of the filter substrate 401, IDT electrodes realizing the SAW resonators 101 to 104, 105, 106, 107, and 121, IDT electrodes realizing the longitudinally coupled SAW resonators 122 and 123, and electrode patterns realizing the connection conductors 111, 112, and 113 are formed. Further, land electrodes realizing the first terminal P12, the second terminal P22, the third terminal P3, and the two fourth terminals P41 and P42 are formed. These IDT electrodes, electrode patterns defining the connection conductors, and land electrodes are formed in predetermined patterns so as to realize the circuit configuration illustrated in FIG. 6.

For example, as illustrated in FIG. 7B, two IDT electrodes 410, a wiring line 411, and a line electrode 412 are provided on the first main surface of the filter substrate 401. The wiring line 411 is connected between the two IDT electrodes 410.

The takeout circuit 200 is realized by the line electrode 412. The line electrode 412 includes a straight line portion 412A and a routing portion 412B. The straight line portion 412A is arranged in parallel with and in the vicinity of the wiring line 411. With such a configuration, the straight line portion 412A, through inductive coupling or capacitive coupling with the wiring line 411, extracts a high-frequency signal from the wiring line 411.

Here, by changing the length and arrangement of the straight line portion 412A, the amplitude and frequency of an extracted high-frequency signal change. For example, when the straight line portion 412A is arranged farther from the wiring line 411, the coupling degree between the straight line portion 412A and the wiring line 411 is reduced and, hence, the amplitude of the extracted high-frequency signal is decreased. When the length of the straight line portion 412A arranged in parallel with the wiring line 411 is increased, the frequency of the extracted high-frequency signal is lowered. With this configuration, the frequency and amplitude of a signal extracted from the wiring line 411 is able to be adjusted and hence, the attenuation characteristics of the filter circuit 100 is able to be adjusted.

The routing portion 412B, as a result of its length being adjusted, adjusts the amount of change in the phase and amplitude of a transmitted high-frequency signal. Specifically, when the routing portion 412 becomes longer, the amplitude of a high-frequency signal becomes smaller. The phase of a high-frequency signal output from the electrode realizing the third terminal P3 changes in accordance with the length of the routing portion 412.

With a configuration like this, the duplexer 2 allows the attenuation characteristics of the filter circuit 100 to be adjusted.

Next, the structure of a duplexer 2A according to a first modification of the duplexer 2 will be described.

Figure 8A:
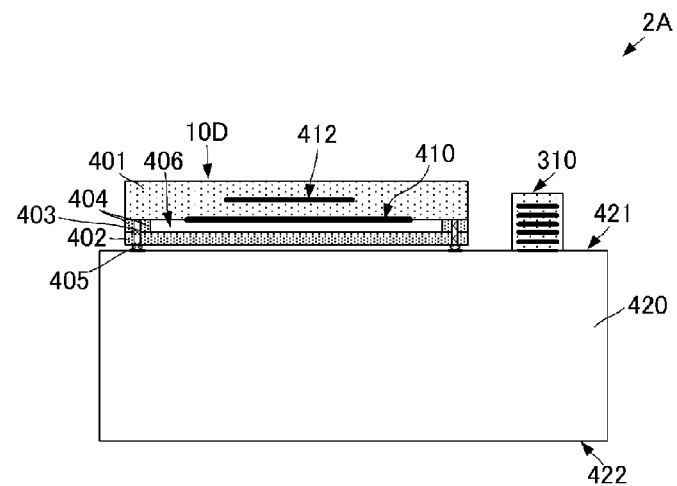
FIGS. 8A-8C illustrate a sectional side view of a duplexer 2A according to a first modification of a preferred embodiment of the present invention, a top view of the duplexer 2A, and a sectional side view of a duplexer 2B according to a second modification of a preferred embodiment of the present invention.
Figure 8B:
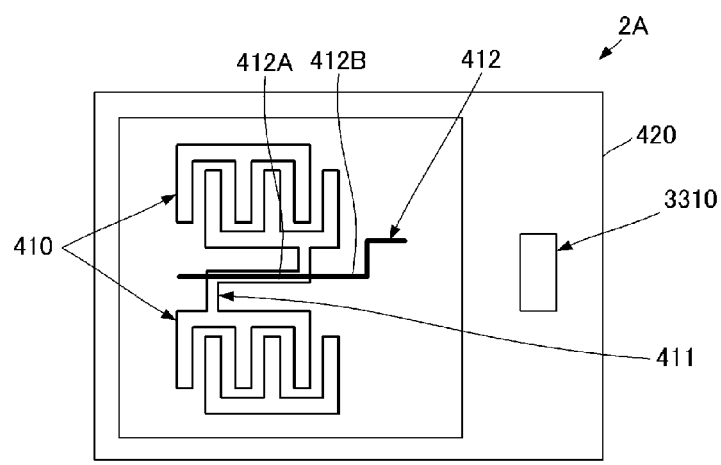

FIG. 8A is a conceptual side view illustrating the main structure of the duplexer 2A. FIG. 8B is a plan view of the filter substrate 401 as seen from the multilayer substrate 420 side.

The duplexer 2A has a structure in which the line electrode 412 realizing the takeout circuit 200 is provided within the filter substrate 401 unlike the structure of the duplexer 2. The description of structures which are the same as those of the duplexer 2 will be omitted.

More specifically, the line electrode 412 is provided within the filter substrate 401 so as to be parallel or substantially parallel with the first main surface of the filter substrate 401, as illustrated in FIG. 8A. The straight line portion 412A is partially superposed with the wiring line 411 in plan view, as illustrated in FIG. 8B.

Also with the configuration like this, the straight line portion 412A is able to extract a high-frequency signal from the wiring line 411 through capacitive coupling or inductive coupling with the wiring line 411.

Figure 8C:
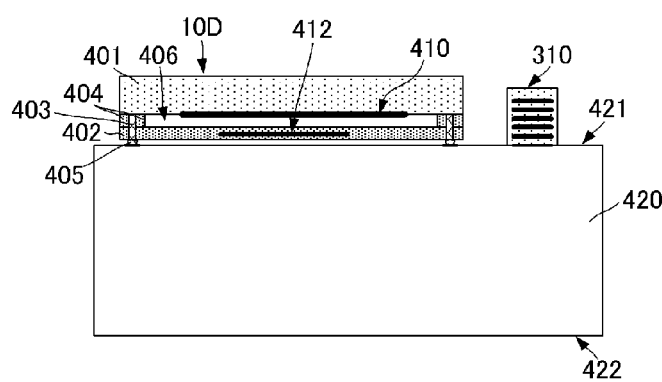

The line electrode 412 realizing the takeout circuit 200 may be provided inside the cover layer 402, rather than within the filter substrate 401. FIG. 8C is a conceptual side view illustrating the main structure of the duplexer 2B in which the line electrode 412 is provided inside the cover layer 402.

The line electrode 412 is provided within the filter substrate 401 so as to be parallel or substantially parallel with the first main surface of the filter substrate 401, as illustrated in FIG. 8C. The straight line portion 412A is arranged so as to be partially superposed with the wiring line 411 in plan view, as illustrated in FIG. 8B.

In the WLP structure, since the electrodes including the line electrode 412 and the wiring are provided inside the cover layer 402 or on the surface (filter-substrate-401-side surface) of the cover layer 402, the mounting area of the high-frequency signal processing unit 10D is decreased.

Next, the structure for realizing a duplexer 2C will be described with reference to FIGS. 9A and 9B. The duplexer 2C preferably has a bare-chip structure.

Figure 9A:
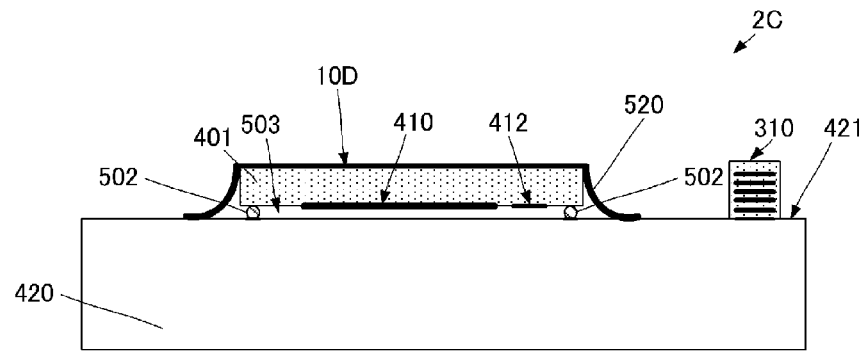
FIGS. 9A and 9B illustrate a sectional side view and a top view of a duplexer 2C implemented so as to have a bare-chip structure.

FIG. 9A is a conceptual side view illustrating the main structure of the duplexer 2C. FIG. 9B is a plan view when the filter substrate 401 is viewed from the multilayer substrate 420 side.

Similarly to the above-described WLP structure, the filter circuit 100, the filter circuit 120, and the takeout circuit 200 are realized by the filter substrate 401. In other words, the IDT electrodes or electrode patterns are provided on the first main surface of the filter substrate 401 or within the filter substrate 401.

The first main surface of the filter substrate 401 and the top surface of the multilayer substrate 420 are arranged so as to be spaced apart from each other by a predetermined distance.

A plurality of bump conductors 502 are connected to the first main surface of the filter substrate 401. The top surface (mounting surface) 421 of the multilayer substrate 420 are connected to the plurality of bump conductors 502. The first terminal P12, the second terminal P22, the third terminal P3, and the fourth terminals P42A and P42B are realized by the plurality of bump conductors 502.

Figure 9B:
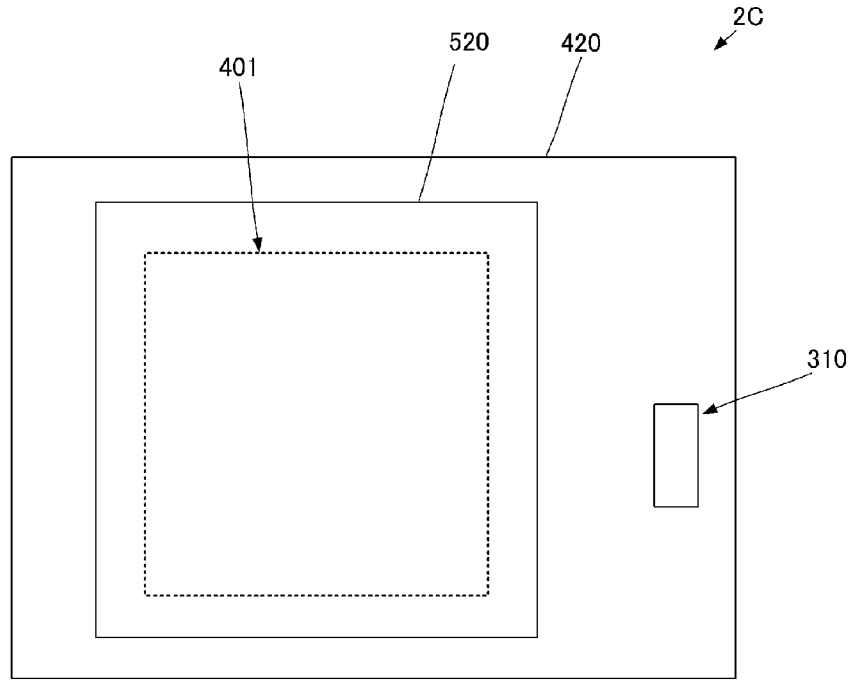

The entire top surface (second main surface) of the filter substrate 401 is covered by an insulating resin film 520, as illustrated in FIG. 9B. The filter substrate 401 is enclosed by the insulating resin film 520 and the top surface 421 of the multilayer substrate 420, as illustrated in FIG. 9A. As a result, a sealed space 503 is provided. With this structure, SAW resonators realized on the first main surface of the filter substrate 401 are not exposed to the external environment. Hence, the resonant characteristics are enhanced and desired characteristics for a filter are accurately realized.

The line electrode 412 realizing the takeout circuit 200 is provided on the first main surface of the filter substrate 401 or within the filter substrate 401, and similarly to, for example, the preferred embodiment illustrated in FIG. 8B, a high-frequency signal is extracted through electromagnetic field coupling from the wiring line 411 realizing the connection conductor 111. Note that, in FIG. 9A, an example is shown in which the line electrode 412 is provided on the first main surface of the filter substrate 401.

Next, a duplexer 2D will be described using FIG. 10. The duplexer 2D preferably has a chip sized package (CSP) structure.

Figure 10:
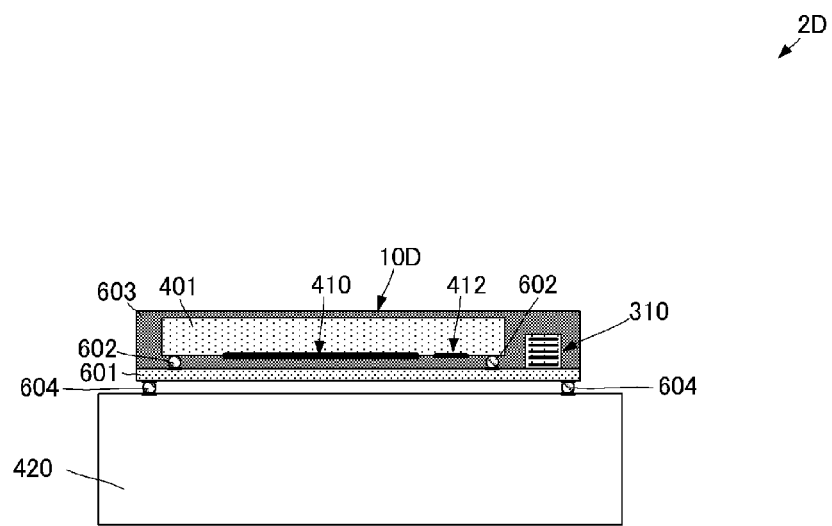
FIG. 10 illustrates a sectional side view and a top view of a duplexer 2D implemented so as to have a CSP structure.

FIG. 10 is a conceptual side view illustrating the main structure of the duplexer 2D.

The filter substrate 401 is mounted on a filter mounting substrate 601 using a plurality of bump conductors 602 such that the first main surface faces the filter mounting substrate 601. The surface of the filter mounting substrate 601 farther from the mounting surface of the filter substrate 401 includes a plurality of external connection bump conductors 604 provided thereon.

The filter mounting substrate 601 preferably is, for example, an alumina substrate and has an area in plan view larger than that of the filter substrate 401 by a predetermined amount.

The first terminal P12, the second terminal P22, the third terminal P3, and the fourth terminals P42A and P42B are realized by the plurality of bump conductors 602 and the plurality of external connection bump conductors 604.

The filter mounting substrate 601 includes the filter circuit 100, circuit patterns excluding the filter circuit 120, and the surface-mount circuit device 310 provided thereon.

A mold resin 603 is applied to the surface of the filter mounting substrate 601 on which the filter substrate 401 is provided. As a result, electrode patterns defining filter electrodes and connection conductors are inhibited from being exposed to the external environment, such that the resonant characteristics of SAW resonators are enhanced and desired characteristics for a filter are accurately realized.

Here, the line electrode 412 realizing the takeout circuit 200 may be provided on the first main surface of the filter substrate 401, as illustrated in FIG. 10, or may be provided within the filter substrate 401. Further, the line electrode 412 may be provided on the filter-substrate-401-side surface of the filter mounting substrate 601, or may be provided within the filter mounting substrate 601. In any of the cases, the straight line portion 412A of the line electrode 412 is able to extract a high-frequency signal from the wiring line 411 realizing the connection conductor 111.

Further, since the duplexer 2D has a CSP structure, the surface-mount circuit device 310 is able to be mounted in a region of the filter mounting substrate 601, where the filter substrate 401 is not mounted. Hence, the duplexer 2D with a small size and a small thickness is realized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a first external connection terminal to which a high-frequency signal is input;
   a second external connection terminal outputting a high-frequency signal; and
   a high-frequency signal processing unit connected between the first external connection terminal and the second external connection terminal; wherein
   the high-frequency signal processing unit includes:
      a first filter circuit including a plurality of filter devices connected in series between the first external connection terminal and the second external connection terminal; and
      a takeout circuit unit one end of which is connected directly or through electromagnetic field coupling with a connection conductor connected to one of the plurality of filter devices of the first filter circuit and the other end of which is connected to a third external connection terminal; wherein
   the third external connection terminal is connected to the second external connection terminal through inductive coupling or capacitive coupling.

2. The high-frequency module according to claim 1, wherein the one end of the takeout circuit unit is connected to the connection conductor through inductive coupling or capacitive coupling.

3. The high-frequency module according to claim 1, further comprising:
   a plate-shaped filter substrate with a first main surface that includes a plurality of IDT electrodes thereon defining the plurality of filter devices;
   a multilayer substrate; and
   a plurality of connection electrodes protruding from the first main surface and being connected to the multilayer substrate; wherein
   the first main surface faces a mounting surface of the multilayer substrate; and
   the filter substrate is enclosed by a resin film.

4. The high-frequency module according to claim 1, comprising:
   a plate-shaped filter substrate on a first main surface of which a plurality of IDT electrodes defining the plurality of filter devices are provided; and
   a plate-shaped filter mounting substrate which is arranged on the first main surface side of the filter substrate and on which the first main surface side of the filter substrate is mounted.

5. The high-frequency module according to claim 1, wherein a matching device is provided between the second external connection terminal and the third external connection terminal.

6. The high-frequency module according to claim 5, wherein the matching device includes a line conductor.

7. The high-frequency module according to claim 5, wherein the matching device has a structure such that a phase of a high-frequency signal is inverted in a band outside of a pass band of the first filter circuit.

8. The high-frequency module according to claim 1, further comprising:
   a plate-shaped filter substrate on a first main surface of which a plurality of IDT electrodes of the plurality of filter devices are provided;
   a plate-shaped cover layer facing the first main surface of the filter substrate with a space therebetween;
   a plurality of connection electrodes protruding from the first main surface and extending through the cover layer; and
   a multilayer substrate; wherein
   the first main surface faces a mounting surface of the multilayer substrate; and
   the filter substrate is connected to the multilayer substrate with the plurality of connection electrodes interposed therebetween.

9. A duplexer comprising:
   the high-frequency module according to claim 1; and
   a second filter circuit; wherein
   one end of the second filter circuit is connected to the second external connection terminal; and
   the other end of the second filter circuit is connected to a fourth external connection terminal.

10. The duplexer according to claim 9, further comprising:
    a plate-shaped filter substrate on a first main surface of which a plurality of IDT electrodes of the plurality of filter devices are provided;
    a plate-shaped cover layer facing the first main surface of the filter substrate with a space therebetween;
    a plurality of connection electrodes protruding from the first main surface and extending through the cover layer; and
    a multilayer substrate; wherein
    the first main surface faces a mounting surface of the multilayer substrate; and
    the filter substrate is connected to the multilayer substrate with the plurality of connection electrodes interposed therebetween.

11. The duplexer according to claim 9, wherein
    the takeout circuit unit is provided on a first main surface of a filter substrate or within the filter substrate; and
    at least one connection electrode of a plurality of connection electrodes is the third external connection terminal.

12. The duplexer according to claim 11, wherein one end of the takeout circuit unit is directly connected to the connection conductor of the first filter circuit.

13. The duplexer according to claim 9, wherein
    the takeout circuit unit is provided on a surface of a cover layer or inside the cover layer; and
    at least one connection electrode of a plurality of connection electrodes is the third external connection terminal.

14. The duplexer according to claim 13, wherein one end of the takeout circuit unit is superposed with the connection conductor when viewed in plan in a direction normal to a first main surface of a filter substrate.

15. The duplexer according to claim 9, further comprising:
    a plate-shaped filter substrate with a first main surface that includes a plurality of IDT electrodes thereon defining the plurality of filter devices;
    a multilayer substrate; and
    a plurality of connection electrodes protruding from the first main surface and being connected to the multilayer substrate; wherein
    the first main surface faces a mounting surface of the multilayer substrate; and
    the filter substrate is enclosed by a resin film.

16. The duplexer according to claim 15, wherein
    the takeout circuit unit is provided on the first main surface of the filter substrate or within the filter substrate; and
    at least one connection electrode among the plurality of connection electrodes is the third external connection terminal.

17. The duplexer according to claim 15, wherein
    the takeout circuit unit is provided within the filter substrate;
    at least one connection electrode among the plurality of connection electrodes is the third external connection terminal; and
    one end of the takeout circuit unit is superposed with the connection conductor when viewed in plan in a direction normal to the first main surface.

18. The duplexer according to claim 9, comprising:
    a plate-shaped filter substrate on a first main surface of which a plurality of IDT electrodes defining the plurality of filter devices are provided; and
    a plate-shaped filter mounting substrate which is arranged on the first main surface side of the filter substrate and on which the first main surface side of the filter substrate is mounted.

* * * * *